United States Patent
Bak et al.

(10) Patent No.: US 10,546,986 B2
(45) Date of Patent: Jan. 28, 2020

(54) LIGHT-EMITTING DEVICE PACKAGE AND LIGHT-EMITTING APPARATUS COMPRISING SAME

(71) Applicant: LG INNOTEK CO., LTD., Seoul (KR)

(72) Inventors: Gyu Hyeong Bak, Seoul (KR); Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 238 days.

(21) Appl. No.: 15/513,510

(22) PCT Filed: Sep. 22, 2015

(86) PCT No.: PCT/KR2015/009930
§ 371 (c)(1),
(2) Date: Mar. 22, 2017

(87) PCT Pub. No.: WO2016/052898
PCT Pub. Date: Apr. 7, 2016

(65) Prior Publication Data
US 2017/0317252 A1  Nov. 2, 2017

(30) Foreign Application Priority Data
Sep. 29, 2014 (KR) .................. 10-2014-0130029

(51) Int. Cl.
*H01L 33/62* (2010.01)
*H01L 33/00* (2010.01)
(Continued)

(52) U.S. Cl.
CPC .......... *H01L 33/62* (2013.01); *H01L 33/0075* (2013.01); *H01L 33/405* (2013.01);
(Continued)

(58) Field of Classification Search
None
See application file for complete search history.

(56) References Cited

U.S. PATENT DOCUMENTS

2006/0262817 A1   11/2006  Yu et al.
2012/0138995 A1*  6/2012   Hwang .................. H01L 33/20
                                                257/98
2014/0153263 A1   6/2014   Palaniswamy et al.

FOREIGN PATENT DOCUMENTS

JP    2003-101080    4/2003
JP    2005-051233    2/2005
(Continued)

OTHER PUBLICATIONS

International Search Report (with English Translation) and Written Opinion dated Dec. 28, 2015 issued in Application No. PCT/KR2015/009930.

*Primary Examiner* — Britt D Hanley
(74) *Attorney, Agent, or Firm* — KED & Associates, LLP (57) ABSTRACT

A light-emitting device package according to an embodiment provides a light-emitting device including a light-emitting structure having a first conductive semiconductor layer, an active layer, and a second conductive semiconductor layer; a package body; first and second lead frames disposed in the package body and disposed to be electrically isolated from each other; a first solder portion of a solid state disposed between the first lead frame and the first conductive semiconductor layer, the first solder portion having a uniform area and an even thickness; and a second solder portion of a solid state disposed between the second lead frame and the second conductive semiconductor layer, the second solder portion having a uniform area and an even thickness.

16 Claims, 6 Drawing Sheets

(51) Int. Cl.
*H01L 33/40* (2010.01)
*H01L 33/48* (2010.01)
*H01L 33/08* (2010.01)
*H01L 33/50* (2010.01)

(52) U.S. Cl.
CPC ............ *H01L 33/08* (2013.01); *H01L 33/486* (2013.01); *H01L 33/505* (2013.01)

(56) References Cited

FOREIGN PATENT DOCUMENTS

| | | |
|---|---|---|
| JP | 2013-161841 | 8/2013 |
| KR | 10-2012-0137865 | 12/2012 |
| KR | 10-1524046 | 6/2015 |

* cited by examiner

LIGHT-EMITTING DEVICE PACKAGE AND LIGHT-EMITTING APPARATUS COMPRISING SAME

CROSS-REFERENCE TO RELATED PATENT APPLICATIONS

This application is a U.S. National Stage Application under 35 U.S.C. § 371 of PCT Application No. PCT/KR2015/009930, filed Sep. 22, 2015, which claims priority to Korean Patent Application No. 10-2014-0130029, filed Sep. 29, 2014, whose entire disclosures are hereby incorporated by reference.

TECHNICAL FIELD

Embodiments relate to a light-emitting device package and a light-emitting apparatus including the package.

BACKGROUND ART

A light-emitting diode (LED) is a kind of semiconductor device that converts electricity into infrared rays or light using the properties of a compound semiconductor to transmit or receive a signal or that is used as a light source.

Group III-V nitride semiconductors have attracted attention as a core material of a light-emitting device, such as a light-emitting diode (LED) or a laser diode (LD), thanks to the physical and chemical properties thereof.

The light-emitting diode exhibits excellent environmentally friendly characteristics, since the light-emitting diode does not include environmentally toxic materials, such as mercury (Hg), which is used in conventional lighting fixtures, such as an incandescent lamp and a fluorescent lamp. In addition, the light-emitting diode has advantages of a long lifespan and low power consumption. For these reasons, the light-emitting diode has replaced conventional light sources.

The adhesive strengths of the respective layers within the light-emitting device package including the light-emitting device are weak, thereby deteriorating the reliability of the light-emitting device package. In addition, there is a problem that a layer having a low CTE is broken due to a difference in the coefficients of thermal expansion (CTEs) of respective layers in the light-emitting device package, thereby further lowering the reliability.

DISCLOSURE

Technical Problem

Embodiments provide a light-emitting device package having the improved adhesive strengths and reliability, and a light-emitting apparatus including the package.

Technical Solution

In an embodiment, a light-emitting device package may include a light-emitting device including a light-emitting structure, the light-emitting structure having a first conductive semiconductor layer, an active layer, and a second conductive semiconductor layer; a package body; first and second lead frames disposed in the package body and disposed to be electrically isolated from each other; a first solder portion of a solid state disposed between the first lead frame and the first conductive semiconductor layer, the first solder portion having a uniform area and an even thickness; and a second solder portion of a solid state disposed between the second lead frame and the second conductive semiconductor layer, the second solder portion having a uniform area and an even thickness.

For example, at least one of the first or second solder portion may have a foil shape.

For example, at least one of the first or second solder portion may have a shape in which the plurality of foil is overlapped. The plurality of foil may be overlapped in a thickness direction of the light-emitting structure.

For example, the light-emitting device may further include a first pad connecting the first conductive semiconductor layer to the first solder portion by passing through the second conductive semiconductor layer and the active layer; a second pad connecting the second conductive semiconductor layer to the second solder portion; and an insulating layer disposed between the second conductive semiconductor layer and the first pad, and between the active layer and the first pad.

For example, the package body may define a cavity, wherein the light-emitting device may be disposed in the cavity.

For example, a total thickness of each of the first and second solder portions may be expressed as below.

$$t_T \leq DE1 - DE2 - T1 - T2$$

Here, $t_T$ represents the total thickness of each of the first and second solder portions, DE1 represents a depth of the cavity, DE2 represents a height difference between an upper surface of the light-emitting element and an upper surface of the cavity, T1 represents a sum of a thickness of the light-emitting structure and a thickness of the insulating layer, and T2 represents a thickness of each of the first and second pads under the insulating layer. Alternatively, the light-emitting device may further include a substrate, wherein the light-emitting structure may be disposed under the substrate, and wherein a total thickness of each of the first and second solder portions may be expressed as below.

$$t_T \leq DE1 - DE2 - T1 - T2 - T3$$

Here, T3 represents a thickness of the substrate.

For example, each of the first and second solder portions may have a thickness of 50 μm or more. Each of the first and second solder portions may have a thickness of 1000 μm or less. For example, each of the first and second solder portions may have a thickness of 100 μm.

For example, the light-emitting device package may further include a molding member embedded in the cavity to surround the light-emitting structure.

For example, the light-emitting device package may further include an insulator disposed between the first lead frame and the second lead frame, to electrically isolate the first lead frame from the second lead frame.

For example, a first width of the insulator in a first direction perpendicular to a thickness direction of the light-emitting structure may be smaller than a second width of the light-emitting structure in the first direction.

For example, the light-emitting device package may further include a metal frame soldering paste disposed under each of the first and second lead frames. The metal frame soldering paste may have a liquid state.

In another embodiment, a light-emitting device package may include a substrate formed of sapphire; a light-emitting device disposed under the substrate and including a light-emitting structure, the light-emitting structure including a first conductive semiconductor layer, an active layer, and a second conductive semiconductor layer, wherein the light-emitting device is formed of GaN; a package body; first and second lead frames disposed in the package body, the first and second lead frames being disposed to be electrically isolated from each other, wherein the first and second lead frames are formed of copper; a first solder portion of a solid state disposed between the first lead frame and the first conductive semiconductor layer, the first solder portion having a uniform area and an even thickness; and a second solder portion of a solid state disposed between the second lead frame and the second conductive semiconductor layer, the second solder portion having a uniform area and an even thickness. For example, each of the first and second solder portions may have a thickness of 100 μm.

In still another embodiment, a light-emitting apparatus may include the light-emitting device package.

Advantageous Effects

A light-emitting device package and a light-emitting apparatus including the package according to embodiments have an excellent heat radiation effect, has improved adhesive strengths and reliability because the first and second solder portions are spread on the first and second lead frames with uniform areas and heights, and may minimize damage to materials such as an insulating layer having a low coefficient of thermal expansion because the first and second solder portions of the solid state have thick thicknesses (or heights), thereby reducing thermal stress.

BEST MODE

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the disclosure to those skilled in the art.

In the following description of the embodiments, it will be understood that, when each element is referred to as being "on" or "under" another element, it can be "directly" on or under another element or can be "indirectly" formed such that an intervening element is also present. In addition, terms such as "on" or "under" should be understood on the basis of the drawings.

In addition, relational terms, such as "first," "second," "above," and "below," are used only to distinguish between one subject or element and another subject or element without necessarily requiring or involving any physical or logical relationship or sequence between such subjects or elements.

In the drawings, the thickness or size of each layer may be exaggerated, omitted, or schematically illustrated for convenience of description and clarity. In addition, the size or area of each constituent element does not entirely reflect the actual size thereof.

Figure 1:
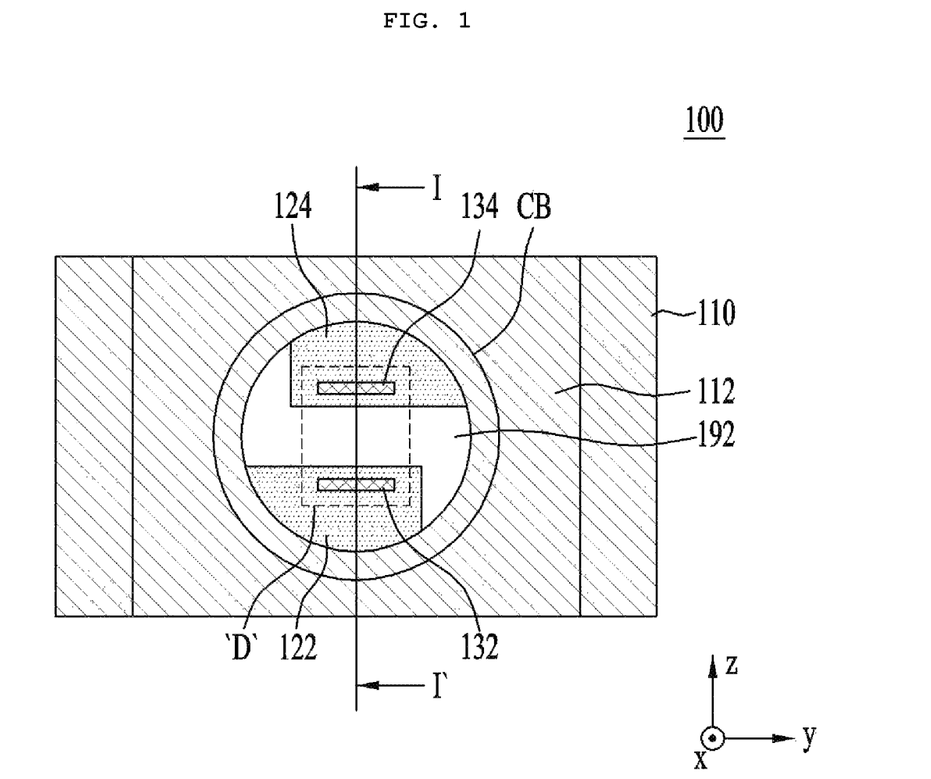
FIG. 1 is a plan view of a light-emitting device package according to an embodiment.
Figure 2:
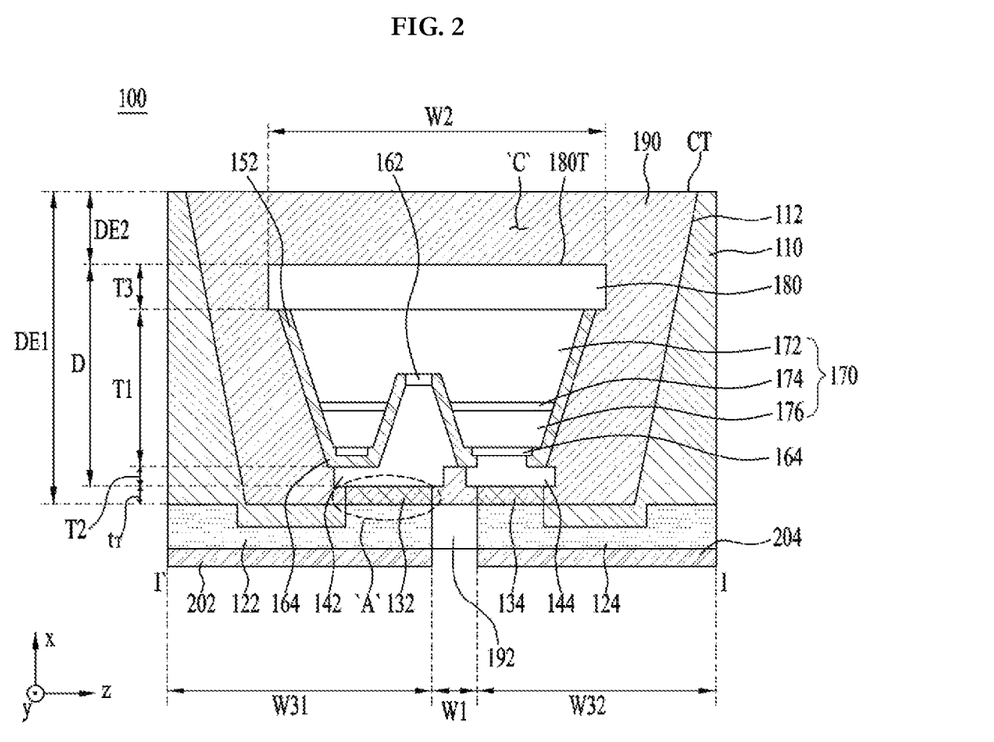
FIG. 2 is a cross-sectional view of a light-emitting device package cut along a line I-I' shown in FIG. 1.
Figure 3:
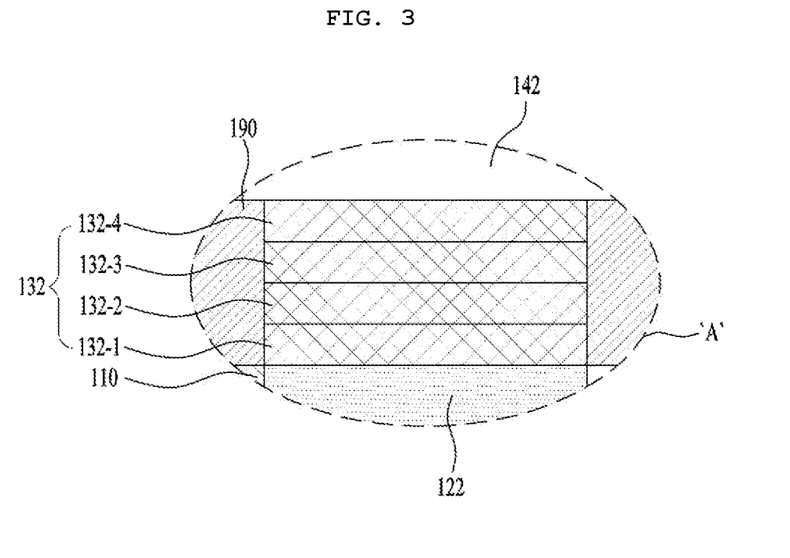
FIG. 3 is an enlarged cross-sectional view of a portion 'A' shown in FIG. 2.

FIG. 1 is a plan view of a light-emitting device package 100 according to an embodiment, FIG. 2 is a cross-sectional view of a light-emitting device package 100 cut along a line I-I' shown in FIG. 1, and FIG. 3 is an enlarged cross-sectional view of a portion 'A' shown in FIG. 2.

For convenience, the light-emitting device package 100 shown in FIGS. 1 to 3 will be described using a Cartesian coordinate system, but the embodiments may be described using various coordinate systems.

Each of the light-emitting device packages 100 shown in FIGS. 1 and 2 may include a light-emitting device D, a package body 110, first and second lead frames 122 and 124, and first and second solder portions 132 and 134.

The light-emitting device D may include a substrate 180, a light-emitting structure 170, first and second contact layers 162 and 164. In some cases, the substrate 180 may be omitted.

The substrate 180 may include a conductive material or a non-conductive material. For example, the substrate 180 may include at least one selected from among a sapphire ($Al_2O_3$), GaN, SiC, ZnO, GaP, InP, $Ga_2O_3$, GaAs, and Si.

A buffer layer (not shown) may be further disposed between the substrate 180 and the light-emitting structure 170, to improve a difference of coefficients of thermal expansion and a lattice mismatch between the substrate 180 and the light-emitting structure 170. For example, the buffer layer may include at least one material selected from among AlN, In, N, and Ga, but the embodiment is not limited thereto. Also, the buffer layer may include a single layer or a multilayer structure.

The light-emitting structure 170 may be disposed under the substrate 180. The light-emitting structure 170 may include a first conductive semiconductor layer 172, an active layer 174, and a second conductive semiconductor layer 176.

The first conductive semiconductor layer 172 may be doped with a first conductivity type dopant and may be made of a Group III-V or Group II-VI compound semiconductor. When the first conductive semiconductor layer 172 is an n-type semiconductor layer, the first conductivity type dopant may be an n-type dopant such as Si, Ge, Sn, Se, or Te, but the embodiment is not limited thereto.

For example, the first conductive semiconductor layer 172 may include a semiconductor material having a formula of $Al_xIn_yGa_{(1-x-y)}N$ ($0 \leq x \leq 1$, $0 \leq y \leq 1$, and $0 \leq x+y \leq 1$). The first conductive semiconductor layer 172 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 174 may be interposed between on the first conductive semiconductor layer 172 and the second conductive semiconductor layer 176, and is a layer in which electrons (or holes) injected through the first conductive semiconductor layer 172 and holes (or electrons) injected through the second conductive semiconductor layer 176 meet each other to emit light having energy determined by the inherent energy band of a constituent material of the active layer 174.

The active layer 174 may be formed into at least one structure of a single-well structure, a multi-well structure, a single-quantum well structure, a multi-quantum well structure, a quantum wire structure, or a quantum dot structure.

The active layer 174 may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be made of a material having a lower band gap energy than that of the barrier layer.

A conductive clad layer (not illustrated) may be formed above and/or under the active layer 174. The conductive clad layer may be formed of semiconductors having higher band gap energy than the band gap energy of the barrier layer of the active layer 174. For example, the conductive clad layer may include GaN, AlGaN, InAlGaN, or a superlattice structure. In addition, the conductive clad layer may be doped with an n-type or p-type dopant.

According to the embodiment, the active layer 174 may emit light in the ultraviolet wavelength band. Here, the ultraviolet wavelength band means a wavelength band of 100 nm to 400 nm. In particular, the active layer 174 may emit light in the wavelength band of 100 nm to 280 nm. However, the embodiment is not limited to the wavelength band of the light emitted from the active layer 174.

The second conductive semiconductor layer 176 may be made of a semiconductor compound and may be made of a Group III-V or Group II-VI compound semiconductor. That is, the second conductive semiconductor layer 176 may include a semiconductor material having a formula of, for example, $In_xAl_yGa_{1-x-y}N$ ($0 \leq x \leq 1$, $0 \leq y \leq 1$, $0 \leq x+y \leq 1$). The second conductive semiconductor layer 176 may be doped with a second conductivity type dopant. When the second conductive semiconductor layer 176 is a p-type semiconductor layer, the second conductivity type dopant is a p-type dopant such as Mg, Zn, Ca, Sr, or Ba.

The first conductive semiconductor layer 172 may be implemented in an n-type semiconductor layer, and the second conductive semiconductor layer 176 may be implemented in a p-type semiconductor layer. Alternatively, the first conductive semiconductor layer 172 may be implemented in a p-type semiconductor layer, and the second conductive semiconductor layer 176 may be implemented in an n-type semiconductor layer.

The light-emitting structure 170 may be implemented in any one structure selected from among an n-p junction structure, a p-n junction structure, an n-p-n junction structure, and a p-n-p junction structure.

Since the light-emitting device package 100 illustrated in FIGS. 1 and 2 has a flip chip bonding structure, light emitted from the active layer 174 may be emitted through the first contact layer 162, the first conductive semiconductor layer 172, and the substrate 180. To this end, the first contact layer 162, the first conductive semiconductor layer 172, and the substrate 180 may be formed of a light transmissive material. At this time, although the second conductive semiconductor layer 176 and the second contact layer 164 may be formed of a transmissive or non-transmissive material, or a reflective material, the embodiment may not be limited to a specific material. The material of each of the first and second contact layers 162 and 164 is described in detail later.

The first contact layer 162 may be disposed between the first conductive semiconductor layer 172 and the first pad 142 to electrically connect the first pad 142 to the first conductive semiconductor layer 172. The first contact layer 162 may include an ohmic contact material, and serve as an ohmic layer. Thus, a separate ohmic layer (not illustrated) may be unnecessary, or a separate ohmic layer may be disposed above or under the first contact layer 162.

The second contact layer 164 may be disposed between the second conductive semiconductor layer 176 and the second pad 144 to electrically connect the second pad 144 to the second conductive semiconductor layer 176.

The first and second contact layers 162 and 164 may be formed of any material that is capable of growing in good quality on the first and second conductive semiconductor layers 172 and 176, respectively. For example, each of the first and second contact layers 162 and 164 may be formed of a metal, and may be formed of Ag, Ni, Al, Rh, Pd, Ir, Ru, Mg, Zn, Pt, Au, Hf, and selective combinations thereof.

In particular, the second contact layer 164 may be a Transparent Conductive Oxide (TCO) film. For example, the second contact layer 164 may include at least one of the aforementioned metal material, Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, or Ni/IrOx/Au/ITO, but is not limited to these materials. The second contact layer 164 may include a material that is in ohmic contact with the second conductive semiconductor layer 176.

Further, the second contact layer 164 may be formed to have a single layer structure or a multilayer structure, using a reflective electrode material having ohmic characteristics. If the second contact layer 164 serves as an ohmic layer, a separate ohmic layer (not illustrated) may be unnecessary.

Also, the light-emitting device D may further include a first pad 142, a second pad 144, and an insulating layer 152.

The first pad 142 may have the form of a through electrode passing through the second conductive semiconductor layer 176 and the active layer 174, but embodiments are not limited thereto. That is, according to another embodiment, although not shown, the first pad 142 may be connected to the first conductive semiconductor layer 172 by bypassing the second conductive semiconductor layer 176 and the active layer 174. The first pad 142 may be disposed between the first solder portion 132 and the first conductive semiconductor layer 172 to electrically connect the first conductive semiconductor layer 172 to the first solder portion 132

The second pad 144 may be disposed between the second conductive semiconductor layer 176 and the second solder portion 134 to electrically connect the second conductive semiconductor layer 176 to the second solder portion 134. At this time, the second pad 144 may have the form of a through electrode connected to the second contact layer 164 by passing through the insulating layer 152, but the embodiment is not limited thereto. That is, according to another embodiment, the second pad 144 may be connected to the second contact layer 164 without passing through the insulating layer 152.

Each of the first and second pads 142 and 144 may include a material for forming electrode.

The insulating layer 152 is disposed between the second conductive semiconductor layer 176 and the first pad 142 to play the role of electrically isolating the second conductive semiconductor layer 176 from the first pad 142. Also, the insulating layer 152 is disposed between the active layer 174 and the first pad 142 to play the role of electrically isolating the active layer 174 from the first pad 142. In addition, the insulating layer 152 may be formed at the edge of the light-emitting structure 170 to protect the light-emitting structure 170, but embodiments are not limited thereto.

The insulating layer 152 may be formed of a light-transmitting insulating material such as $SiO_2$, $SiO_x$, $SiO_xN_y$, or $Al_2O_3$, but embodiments are not limited to materials of the insulating layer 152.

Referring to FIGS. 1 and 2, the package body 110 may define a cavity C. For example, as shown in FIG. 2, the package body 110 may define the cavity C together with the first and second lead frames 122 and 124. That is, the cavity C may be defined by a side surface 112 of the package body 110 and upper surfaces of the first and second lead frames 122 and 124. However, the embodiment is not limited thereto. According to another embodiment, the package body 110 may have a flat upper surface instead of a stepped upper surface as illustrated in FIG. 2. In this case, a partition wall (not shown) may be disposed to form a cavity on the flat upper surface of the package body 110. In FIG. 1, the notation of 'CB' means a bottom surface of the cavity C.

Although the package body 110 may be implemented by an Epoxy Molding Compound (EMC), the embodiment is not limited to the material of the package body 110.

The first and second lead frames 122 and 124 may be disposed to be electrically isolated from each other in the package body 110. For example, first and second lead frames 122 and 124 may be disposed to be electrically isolated from each other, in the z-axis direction which is perpendicular to a thickness direction of the light-emitting structure 170. For this, the light-emitting device package 100 may further include an insulator 192. The insulator 192 may be disposed between the first and second lead frames 122 and 124, in order to electrically isolate the first and second lead frames 122 and 124 from each other.

The insulator 192 may be formed of a material having electrical non-conductivity, for example, $SiO_2$, $SiO_x$, $SiO_xN_y$, $Si_3N_4$, or $Al_2O_3$, but the embodiment is not limited to the material of the insulator 192.

In addition, when the package body 110 is formed of a conductive material, for example, a metal material, the first and second lead frames 122 and 124 may constitute a portion of the package body 110. In this case, the first and second lead frames 122 and 124 of the package body 110 may be electrically isolated from each other by the insulator 192.

In the case of the light-emitting device package 100 according to the above-described embodiment, the first width of the insulator 192 in the first direction (the y-axis direction and/or the z-axis direction) perpendicular to the thickness direction of the light-emitting structure 170 may be smaller than the second width of the light-emitting structure 170 in the first direction. For example, the first width W1 of the insulator 192 in the z-axis direction may be smaller than the second width W2 of the light-emitting structure 170 in the z-axis direction.

Further, as illustrated in FIG. 2, the first and second lead frames 122 and 124 may be attached, combined, inserted, or disposed to the package body 110 in various forms. Although the first and second lead frames 122 and 124 are shown as being disposed within the package body 110 in the case of the embodiment, the first and second lead frames 122 and 124 may be disposed outside the package body 110 according to another embodiment. That is, as long as the first and second lead frames 122 and 124 may be electrically connected to the first and second solder portions 132 and 134, the embodiment is not limited to a specific cross-sectional or planar shape of the first and second lead frames 122 and 124.

Each of the first and second lead frames 122 and 124 may be made of a conductive material, for example, metal, and the embodiment is not limited to the kind of material of each of the first and second lead frames 122 and 124.

In case of the embodiment illustrated in FIG. 2, the first and second solder portions 132 and 134 are attached to the upper surfaces of the first and second lead frames 122 and 124, respectively, whereas the metal frame soldering pastes 202 and 204 of the liquid state may be attached to lower surfaces of the first and second lead frames 122 and 124, respectively. Here, the soldering pastes 202 and 204 may be attached at a low temperature, not at a high temperature, so as not to remelt the first and second solder portions 132 and 134.

The first solder portion 132 may be disposed between the first lead frame 122 and the first pad 142 and electrically connect the first lead frame 122 to the first conductive semiconductor layer 172 via the first pad 142 to form a current flow therebetween. Similarly to this, the second solder portion 134 may be disposed between the second lead frame 124 and the second pad 144 and electrically connect the second lead frame 124 to the second conductive semiconductor layer 176 via the second pad 144 to form a current flow therebetween. Each of the first and second solder portions 132 and 134 may be in a solid state.

As described above, since each of the first and second solder portions 132 and 134 is in a solid state, not in a liquid state, the first and second solder portions 132 and 134 may have uniform areas, and therefore heights and be formed thick. Here, it is defined that a thickness direction (e.g., x-axis direction) of the light-emitting structure 170 is a 'second direction;' a y-axis direction among the first direction (the y-axis direction and/or z-axis direction) perpendicular to the second direction is a 'first-first direction'; the z-axis direction is a 'first-second direction.' Under the above definitions on the directions, an area of each of the first and second solder portions 132 and 134 may be represented as a product of a length (i.e., y-axis direction) in the first-first direction and a width in the first-second direction (i.e. z-axis direction). Then, as shown in FIG. 2, an area of each of the first and second solder portions is constant without being changed as being approaching to the second direction (i.e., the x-axis direction), and therefore, each of the first and second solder portions 132 and 134 may be regarded as having a uniform area. Also, when each of the first and second solder portions 132 and 134 has a uniform area, a width of each of the first and second solder parts 132 and 134 in the first-second direction (i.e. z-axis direction) is constant without being changed as being approaching to the second direction (i.e., the x-axis direction).

In addition, each of the first and second solder portions 132 and 134 may have a foil shape, but the embodiment is not limited to this. That is, as long as the first and second solder portions 132 and 134 may be in the solid state, the embodiment is not limited to the shape of the first and second solder portions 132 and 134.

Further, each of the first and second solder portions 132 and 134 may have a shape in which the plurality of foil is overlapped. For example, referring to FIG. 3, the first solder portion 132 may have a shape in which four pieces of foil 132-1, 132-2, 132-3, and 132-4 are overlapped in a vertical direction namely, in the thickness direction (that is, x-axis direction) of the light-emitting structure 170. However, according to another embodiment, each of the first and second solder portions 132 and 134 may have a shape in which the thin foil of more or less than four is stacked vertically.

Still further, unlike FIG. 2, when the substrate 180 is omitted in the light-emitting device D, the total thickness $t_T$ of each of the first and second solder portions 132 and 134 may be expressed by the following equation (1).

$$t_T \leq DE1 - DE2 - T1 - T2 \quad \text{Equation 1}$$

Here, DE1 represents the depth of the cavity C, DE2 represents the height difference between the upper surface 180T of the light-emitting element D and the upper surface CT of the cavity C, T1 represents the sum of the thickness of the light-emitting structure 170 and the thickness of the insulating layer 152, and T2 represents the thickness of each of the first and second pads 142 and 144 under the insulating layer 152.

However, as shown in FIG. 2, when the light-emitting device D includes the substrate 180, the total thickness $t_T$ of each of the first and second solder portions 132 and 134 may be expressed by the following equation (2).

$$t_T \leq DE1 - DE2 - T1 - T2 - T3 \quad \text{Equation 2}$$

Here, T3 represents a thickness of the substrate 180.

The thickness $t_T$ of each of the first and second solder portions 132 and 134 may be 50 μm or more and/or 1000 μm or less, but the embodiment is not limited thereto.

Each of the first and second solder portions 132 and 134 may be made of a conductive material, but the embodiment is not limited to the specific material of the first and second solder portions 132 and 134. That is, each of the first and second solder portions 132 and 134 may include a solid material having conductivity.

Referring again to FIG. 2, the light-emitting device package 100 may further include a molding member 190. The molding member 190 may be embedded in the cavity C to surround and protect the light-emitting element D. The molding member 190 may be formed of, for example, silicon (Si), and may contain phosphors, thus being capable of changing the wavelength of light emitted from the light-emitting device D. Although the phosphors may include phosphors selected from among YAG-based, TAG-based, silicate-based, sulfide-based, and nitride-based wavelength change materials which may change light generated from the light-emitting device D into white light, the embodiment is not limited to the kinds of phosphors.

The YGA-based and TAG-based phosphors may be selected from among (Y, Tb, Lu, Sc, La, Gd, Sm)3(Al, Ga, In, Si, Fe)5(O, S)12:Ce, and the silicate-based phosphors may be selected from among (Sr, Ba, Ca, Mg)2SiO4:(Eu, F, Cl).

In addition, the sulfide-based phosphors may be selected from among (Ca, Sr)S:Eu, (Sr, Ca, Ba) (Al, Ga)2S4:Eu, and the nitride-based phosphors may be selected from among (Sr, Ca, Si, Al, O)N:Eu (e.g., CaAlSiN4:Eu β-SiAlON:Eu) or Ca-α SiAlON:Eu-based (Cax, My) (Si, Al)12(O, N)16 (here, M is at least one of Eu, Tb, Yb or Er, 0.05<(x+y)<0.3, 0.02<x<0.27, and 0.03<y<0.3, which may be the selected phosphor).

Red phosphors may be nitride-based phosphors including N (e.g., CaAlSiN3:Eu). The nitride-based red phosphors have higher reliability in resistance to external environments such as, for example, heat and moisture and lower discoloration risk than sulfide-based phosphors.

Hereinafter, a method for manufacturing the aforementioned light-emitting device package 100 illustrated in FIGS. 1 and 2 will be described with reference to the accompanying drawings. However, the light-emitting device package 100 may be manufactured may be manufactured by various methods other than the manufacturing method described below.

Figure 4A:
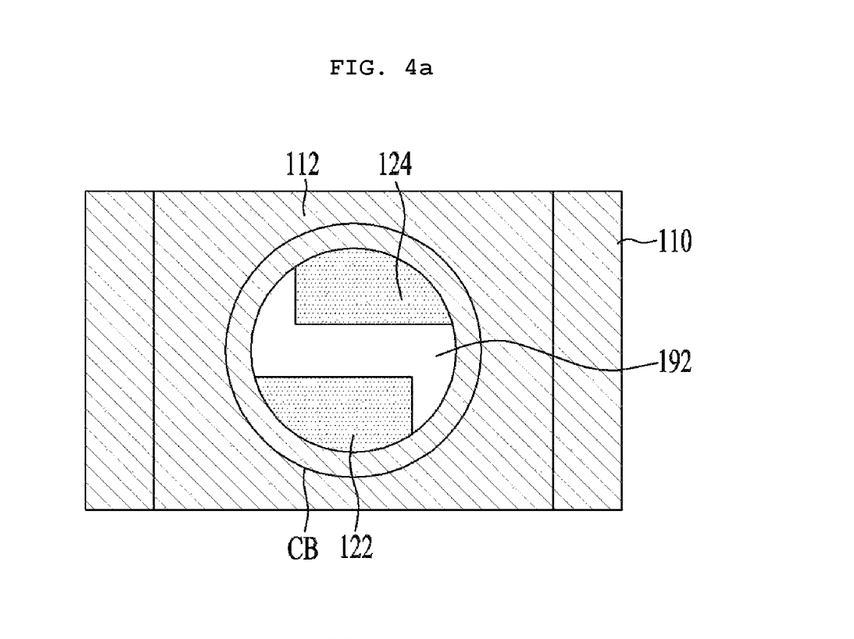
FIGS. 4a to 4c show plan views illustrating a process of a method for manufacturing the light-emitting device package shown in FIGS. 1 and 2.
Figure 4B:
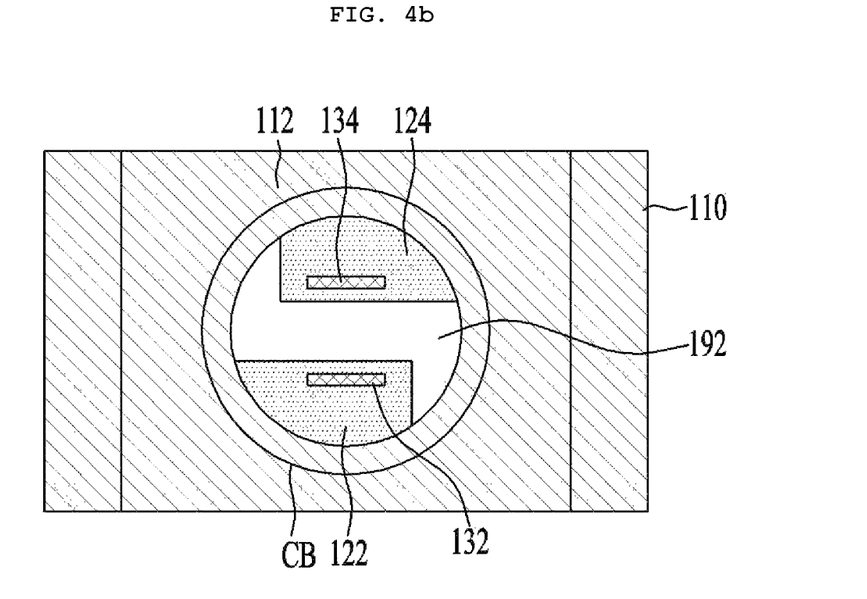
Figure 4C:
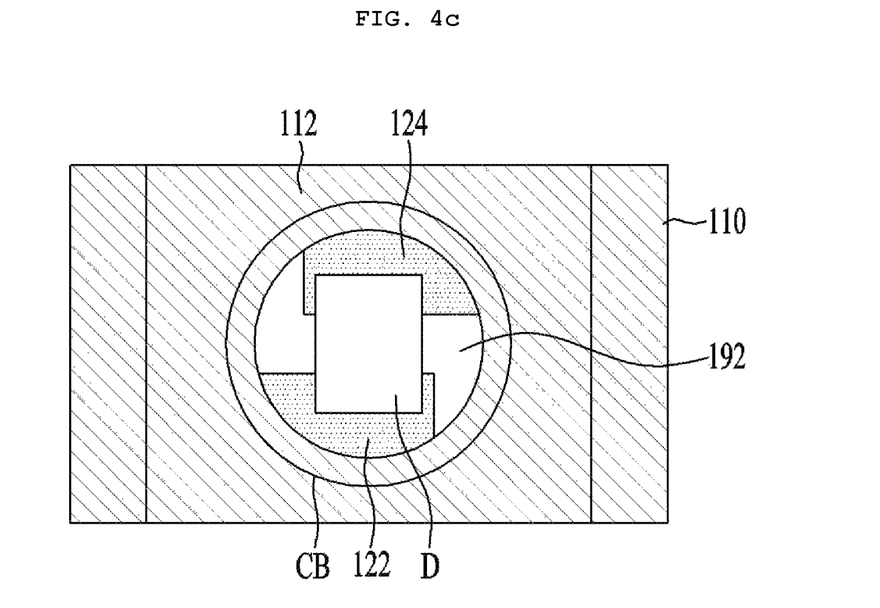
Figure 5A:
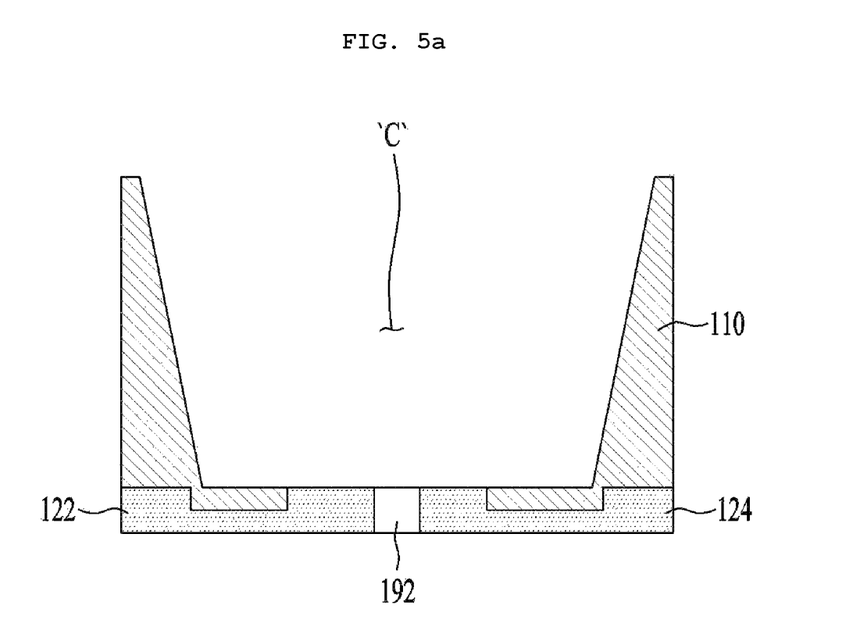
FIGS. 5a to 5c show cross-sectional views illustrating the process of a method for manufacturing the light-emitting device package shown in FIGS. 1 and 2.
Figure 5B:
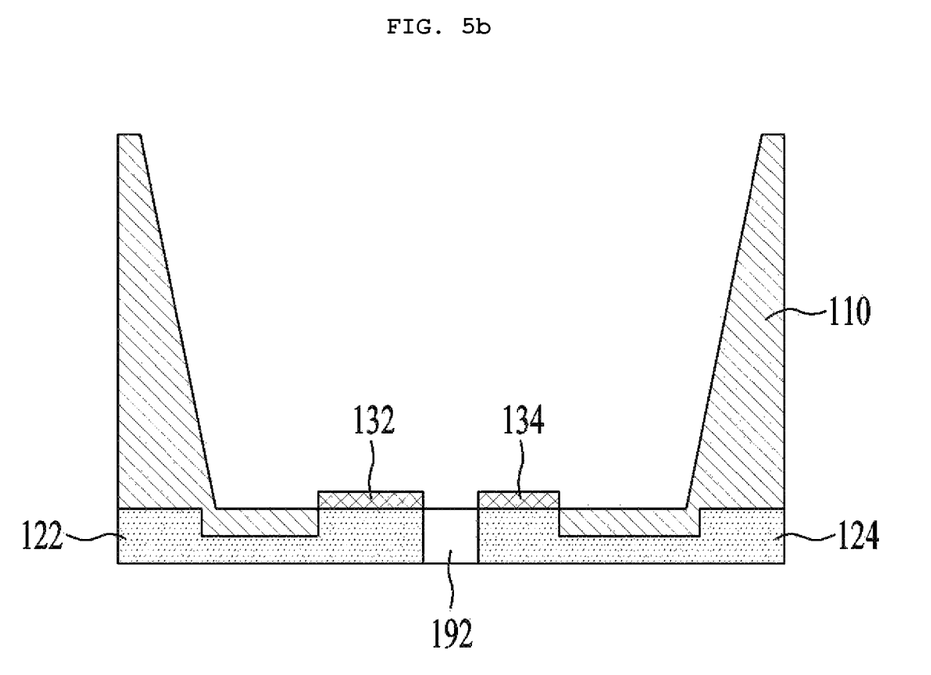
Figure 5C:
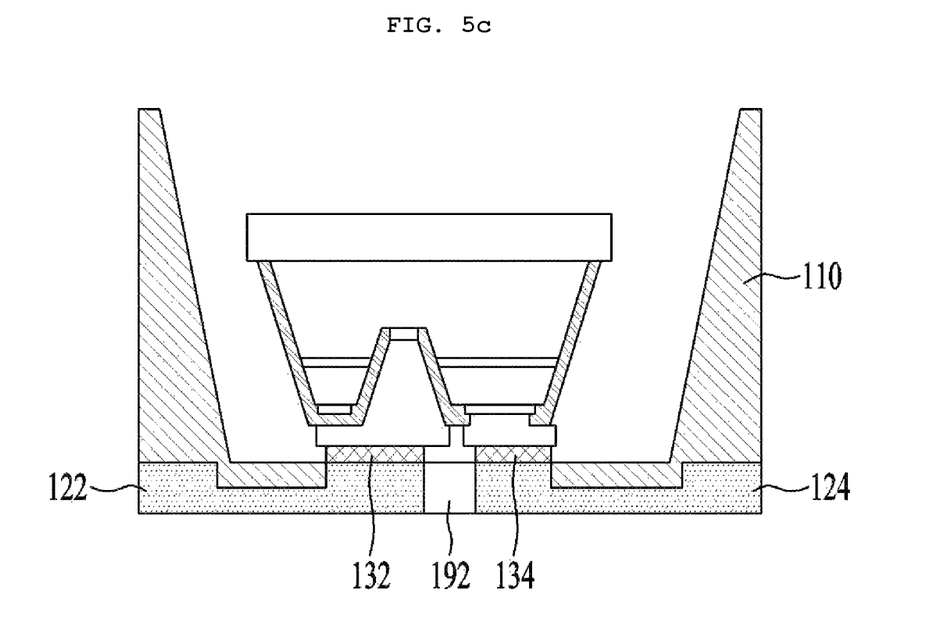

FIGS. 4a to 4c are plan views illustrating a process of a method for manufacturing the light-emitting device package 100 shown in FIGS. 1 and 2, and FIGS. 5a to 5c show cross-sectional views illustrating the process of a method for manufacturing the light-emitting device package 100 shown in FIGS. 1 and 2. For convenience of illustration, the illustration of the molding member 190 shown in FIG. 2 has been omitted from FIGS. 4a to 4c and FIGS. 5a to 5c. Also, the light-emitting device D shown in FIG. 5c is the same as the light-emitting device D shown in FIG. 2, and therefore, the illustration of the reference numerals is omitted in FIG. 5c.

Referring to FIGS. 4a and 5a, first and second lead frames 122 and 124 are formed in a package body 110 having a cavity C. Here, the first and second lead frames 122 and 124 may be electrically isolated from each other by an insulator 192.

Thereafter, referring to FIGS. 4b and 5b, a first solder portion 132 is formed to be attached on the first lead frame 122 and a second solder portion 134 is formed to be attached on the second lead frame 124. Here, since the first and second solder portions 132 and 134 are in the solid state rather than in the liquid state, they may have uniform areas and heights.

In addition, the first and second solder portions 132 and 134 may have a foil shape that is in a solid state rather than in a liquid state.

In addition, each of the first and second solder portions 132 and 134 may have a shape in which the plurality of foil in a solid state is overlapped in the vertical direction. In this manner, when each of the first and second solder portions 132 and 134 is in a solid state, each of the first and second solder portions 132 and 134 may be formed to have a desired height (or a thickness).

Thereafter, referring to FIGS. 4c and 5c, the light-emitting device D is mounted on the package body 110 by bonding the first and second pads 142 and 144 of the light-emitting device D into the first and second solder portions 132 and 134, respectively, in order to electrically connect the first pad 142 to the first solder portion 132 and to electrically connect the second pad 144 to the second solder portion 134.

Thereafter, the results shown in FIGS. 4c and 5c may be thermally reflowed by hot air.

In the case of the light-emitting device package 100 as described above, since each of the first and second solder portions 132 and 134 is made up of foil of a solid state other than of a liquid state, the first width W1 may be relatively reduced as compared with the case where each of the first and second solder portions 132 and 134 is in a liquid state. This is because, if the first and second solder portions 132 and 134 are formed to have liquid state and if the first and second solder portions 132 and 134 of the liquid state are pressurized in the −x axis direction by the first and second pads 142 and 144, the first and second solder portions 132 and 134 may be spread in the z-axis and y-axis directions. Considering this, the first width W1 should be secured to be sufficiently wide so that the liquid first and second solder portions 132 and 134 do not stick together.

On the other hand, according to the embodiment, since each of the first and second solder portions 132 and 134 is formed in the foil shape of a solid state rather of a liquid state, it is not necessary to secure the first width W1 wide. Therefore, as compared with the case where each of the first and second solder portions 132 and 134 has a liquid state, the first width W1 may be relatively reduced when each of the first and second solder portions 132 and 134 has a solid state. Then, the third-first width W31 of the first lead frame 122 and the third-second width W32 of the second lead frame 124 may increase by a degree by which the first width W1 decreases. Thus, in case that the third-first width W31 and third-second width and W32 increase, the heat radiation effect of the light-emitting device package 100 may be improved. This is because the volume of the first and second lead frames 122 and 124 made of a conductive material increase and the heat may be transmitted through the first and second lead frames 122 and 124 having increased volume.

In addition, in case that the first and second solder pastes 132 and 134 have not the solid state but the liquid state, there may be a technical limit to spread the solder pastes of the liquid state on the first and second lead frames 122 and 124 at uniform areas and heights so that the adhesive strength and the reliability of the solder pastes may be deteriorated. This is because the solder paste of the liquid is typically spread using a pin dotting or by using a squeezer applying onto the first and second lead frames 122 and 124. On the other hand, since the first and second solder portions 132 and 134 according to the embodiment are formed in the foil shape of a solid state rather than of a liquid state, the first and second solder portions 132 and 134 may be spread on the first and second lead frames 122 and 124 with uniform areas and heights, thereby improving adhesive strength and reliability.

Further, when the solder paste of the liquid state is formed on the first and second lead frames 122 and 124 with uneven thickness, the thermal stress may increase. On the other hand, in the embodiment, since each of the first and second solder portions 132 and 134 has a foil of a solid state, the first and second solder portions 132 and 134 may be formed on the first and second lead frames 122 and 124 with even and thick thickness. Because of this, in comparison to the solder pastes of the liquid state, the first and second solder portions 132 and 134 having a foil shape of the solid state may be formed at a relatively high heights (or thick thicknesses). Thus, if the heights (or thicknesses) of the first and second solder portions 132 and 134 increase, the thermal stress decreases so that damage to the material having a lower CTE such as the insulating layer 152 in the light-emitting device package 100 may be minimized.

The degree of thermal stress of the first and second solder portions 132 and 134 is expressed by the following equation (3) using Engelmaier Joint fatigue model.

$$\Delta\gamma = C\frac{L_P}{t_T}\Delta\alpha\Delta TEM \qquad \text{Equation 3}$$

Here, $\Delta\gamma$ represents the degree of thermal stress of each of the first and second solder portions 132 and 134, C represents the calibration coefficient, $L_P$ represents the diagonal distance of each of the first and second solder portions 132 and 134, $\Delta\alpha$ represents the difference in CTE, and $\Delta TEM$ represents the temperature difference.

As seen from Equation (3), it may be seen that, when the height, that is, thickness $t_T$ of the first and second solder portions 132 and 134 increases, the thermal stress ($\Delta\gamma$) of each of the first and second solder portions 132 and 134 decreases.

It is assumed that the substrate 180 is made of sapphire, the light-emitting structure 170 is made of GaN, the insulating layer 152 is made of $SiO_2$, each of the first and second solder portions 132 and 134 is made of SAC305, and each of the first and second lead frames 122 and 124 is made of Copper (Cu). Under these assumption, the CTEs of sapphire, GaN, $SiO_2$, SAC305, and Cu are $7.5\times10^{-6}/°$ C., $5.59\times10^{-6}/°$ C., $0.55\times10^{-6}/°$ C., $22\times10^{-6}/°$ C., and $16.5\times10^{-6}/°$ C., respectively. As such, it may be seen that the CTEs of the first and second solder portions 132 and 134 and the first and second lead frames 122 and 124 are much larger than the CTE of the light-emitting element D. When the CTE difference becomes large, the insulating layer 152 having the lowest CTE is destroyed, thereby incurring a low current failure.

Therefore, according to the embodiment, since the first and second solder portions 132 and 134 have the solid state, the thickness $t_T$ of each of the first and second solder portions of the solid state 132 and 134 may uniformly increase so that the degree ($\Delta\gamma$) of the thermal stress as in Equation (3) decreases, thereby preventing destruction of the insulating layer 152. For example, it may be seen that, as the thickness $t_T$ of each of the first and second solder portions 132 and 134 increases, the thermal stress at the boundary between the first and second pads 142 and 144 and the insulating layer 152 may be reduced by 32% from the reference value, as shown in the following Table 1.

TABLE 1

| THICKNESS ($t_T$) (μm) | THERMAL STRESS (%) |
|---|---|
| REFERENCE VALUE (30) | 100 |
| 40 | 91 |
| 100 | 68 |

An array of a plurality of light-emitting device packages according to the embodiment may be disposed on a substrate, and optical members such as, for example, a light guide plate, a prism sheet, and a diffuser sheet may be disposed in an optical path of the light-emitting device packages. The light-emitting device packages, the substrate, and the optical members may function as a backlight unit.

In addition, the light-emitting device package according to the embodiment may be included in a light-emitting apparatus such as, for example, a display apparatus, an indicator apparatus, and a lighting apparatus.

Here, the display apparatus may include a bottom cover, a reflective plate disposed on the bottom cover, a light-emitting module configured to emit light, a light guide plate disposed in front of the reflective plate to forwardly guide light emitted from the light-emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. Here, the bottom cover, the reflective plate, the light-emitting module, the light guide plate, and the optical sheets may constitute a backlight unit.

In addition, the lighting apparatus may include a substrate, a light source module which includes the light-emitting device package according to the embodiment, a radiator configured to radiate heat of the light source module, and a power supply unit configured to process or convert an electrical signal from an external source so as to supply the same to the light source module. For example, the lighting apparatus may include a lamp, a headlamp, or a streetlight.

The headlamp may include a light-emitting module which includes the light-emitting device packages disposed on a substrate, a reflector configured to reflect light emitted from the light-source module in a given direction, for example, forwardly, a lens configured to forwardly refract light reflected by the reflector, and a shade configured to achieve a light distribution pattern desired by a designer by blocking or reflecting some of light, reflected by the reflector and directed to the lens.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

MODE FOR INVENTION

Various embodiments have been described in the best mode for carrying out the invention.

INDUSTRIAL APPLICABILITY

The light-emitting device package and the light-emitting apparatus including the package according to the embodiments may play the role of the backlight unit, and may be used for a light-emitting apparatus such as a display apparatus, an indicator apparatus, and a lighting apparatus.

The invention claimed is:

1. A light-emitting device package, comprising:
a light-emitting device including a light-emitting structure, a first pad and a second pad;
first and second lead frames disposed to be electrically isolated from each other;
a package body disposed on the first and second lead frames, the package body including a cavity in which the light-emitting device is disposed;
a first solder portion configured to be electrically connected to the light-emitting device and the first lead frame; and
a second solder portion configured to be electrically connected to the light-emitting device and the second lead frame,
wherein the light-emitting structure includes a first conductivity type semiconductor layer, a second conductivity type semiconductor layer, and an active layer disposed between the first conductivity type semiconductor layer and the second conductivity type semiconductor layer,
wherein the first pad is configured to be electrically connected to the first conductive type semiconductor layer,
wherein the second pad is configured to be electrically connected to the second conductivity type semiconductor layer,
wherein the first lead frame includes a first recess on a top surface thereof, and a first pad portion,
wherein the second lead frame includes a second recess on a top surface thereof and a second pad portion,
wherein a portion of the package body is disposed in the first recess and the second recess,
wherein the first solder portion is disposed between the first pad portion of the first lead frame and the first pad of the light-emitting device,
wherein the second solder portion is disposed between the second pad portion of the second lead frame and the second pad of the light-emitting device, and
wherein a bottom surface of the cavity includes an upper surface of the portion of the package body, the first pad portion, and the second pad portion.

2. The light-emitting device package according to claim 1, wherein at least one of the first or second solder portion has a shape of a foil.

3. The light-emitting device package according to claim 1, wherein at least one of the first or second solder portion has a shape in which a first one of a plurality of foils is overlapped with a second one of the plurality of foils.

4. The light-emitting device package according to claim 3, wherein the first one of the plurality of foils is overlapped with the second one of the plurality of foils.

5. The light-emitting device package according to claim 1, wherein a total thickness of each of the first and second solder portions is expressed as follows:

$$t_T \leq DE1 - DE2 - T1 - T2$$

(Here, $t_T$ represents the total thickness of each of the first and second solder portions, DE1 represents a depth of the cavity, DE2 represents a height difference between an upper surface of the light-emitting element and an upper surface of the cavity, T1 represents a sum of a thickness of the light-emitting structure and a thickness of an insulating layer, and T2 represents a thickness of each of the first and second pads under the insulating layer).

6. The light-emitting device package according to claim 1, wherein the light-emitting device further includes a substrate,
wherein the light-emitting structure is disposed under the substrate.

7. The light-emitting device package according to claim 6, wherein a total thickness of each of the first and second solder portions is expressed as follows:

$$t_T \leq DE1 - DE2 - T1 - T2 - T3$$

(Here, $t_T$ represents the total thickness of each of the first and second solder portions, DE1 represents a depth of the cavity, DE2 represents a height difference between an upper surface of the light-emitting element and an upper surface of the cavity, T1 represents a sum of a thickness of the light-emitting structure and a thickness of an insulating layer, T2 represents a thickness of each of the first and second pads under the insulating layer, and T3 represents a thickness of the substrate).

8. The light-emitting device package according to claim 1, wherein each of the first and second solder portions has a thickness of 50 μm or more.

9. The light-emitting device package according to claim 1, wherein each of the first and second solder portions has a thickness of 1000 μm or less.

10. The light-emitting device package according to claim 1, wherein each of the first and second solder portions has a thickness of 100 μm.

11. The light-emitting device package according to claim 1, further comprising a molding member embedded in the cavity to surround the light-emitting structure.

12. The light-emitting device package according to claim 1, further comprising a metal frame soldering paste disposed under each of the first and second lead frames.

13. The light-emitting device package according to claim 12, wherein the metal frame soldering paste has a liquid state.

14. A light-emitting device package, comprising:
a substrate formed of sapphire;
a light-emitting device disposed under the substrate and including a light-emitting structure, a first pad and a second pad, wherein the light-emitting device is formed of GaN;
first and second lead frames disposed to be electrically isolated from each other, wherein the first and second lead frames are formed of copper;
a package body disposed on the first and second lead frames, the package body including a cavity in which the light-emitting device is disposed;
a first solder portion configured to be electrically connected to the light-emitting device and the first lead frame; and
a second solder portion configured to be electrically connected to the light-emitting device and the second lead frame,
wherein the light-emitting structure includes a first conductivity type semiconductor layer, a second conductivity type semiconductor layer, and an active layer disposed between the first conductivity type semiconductor layer and the second conductivity type semiconductor layer,
wherein the first pad is configured to be electrically connected to the first conductive semiconductor layer,
wherein the second pad is configured to be electrically connected to the second conductivity type semiconductor layer,
wherein the first lead frame includes a first recess on a top surface thereof, and a first pad portion,
wherein the second lead frame includes a second recess on a top surface thereof and a second pad portion,
wherein a portion of the package body is disposed in the first recess and the second recess,
wherein the first solder portion is disposed between the first pad portion of the first lead frame and the first pad of the light-emitting device,
wherein the second solder portion is disposed between the second pad portion of the second lead frame and the second pad of the light-emitting device, and
wherein a bottom surface of the cavity includes an upper surface of the portion of the package body, the first pad portion, and the second pad portion.

15. The light-emitting device package according to claim 14, wherein each of the first and second solder portions has a thickness of 100 μm.

16. The light-emitting device package according to claim 1, wherein the first solder portion includes a portion that has a lateral width same or less than a lateral width of the first pad portion, and
wherein the second solder portion includes a portion that has a lateral width same or less than a lateral width of the second pad portion.

* * * * *